(12) United States Patent
Valiente (10) Patent No.: US 11,363,746 B2
(45) Date of Patent: Jun. 14, 2022

(54) EMI SHIELDING FOR A SIGNAL TRACE

(71) Applicant: Teradyne, Inc., North Reading, MA (US)

(72) Inventor: Luis A. Valiente, Dracut, MA (US)

(73) Assignee: TERADYNE, INC., North Reading, MA (US)

( * ) Notice: Subject to any disclaimer, the term of this patent is extended or adjusted under 35 U.S.C. 154(b) by 207 days.

(21) Appl. No.: 16/563,143

(22) Filed: Sep. 6, 2019

(65) Prior Publication Data
US 2021/0076546 A1    Mar. 11, 2021

(51) Int. Cl.
| | |
|---|---|
| *H05K 9/00* | (2006.01) |
| *H05K 1/02* | (2006.01) |
| *G01R 31/28* | (2006.01) |
| *G01R 1/18* | (2006.01) |

(52) U.S. Cl.
CPC ............. *H05K 9/0081* (2013.01); *G01R 1/18* (2013.01); *G01R 31/2834* (2013.01); *H05K 1/0216* (2013.01); *H05K 1/0242* (2013.01); *H05K 2201/10409* (2013.01)

(58) Field of Classification Search
CPC .. H05K 9/0081; H05K 1/0216; H05K 1/0242; H05K 2201/10409; H05K 2201/09745; H05K 3/0061; G01R 31/2834; G01R 1/18
USPC .................................................... 324/750.27
See application file for complete search history.

(56) References Cited

U.S. PATENT DOCUMENTS

| | | |
|---|---|---|
| 3,516,077 A | 6/1970 | Bobeck et al. |
| 3,577,131 A | 5/1971 | Morrow et al. |
| 3,673,433 A | 6/1972 | Kupfer |
| 3,934,236 A | 1/1976 | Aiken et al. |
| 4,021,790 A | 5/1977 | Aiken et al. |
| 4,117,543 A | 9/1978 | Minnick et al. |
| 4,692,839 A | 9/1987 | Lee et al. |
| 4,729,166 A | 3/1988 | Lee et al. |
| 4,754,546 A | 7/1988 | Lee et al. |
| 4,757,256 A | 7/1988 | Whann et al. |
| 4,758,785 A | 7/1988 | Rath |
| 4,778,950 A | 10/1988 | Lee et al. |
| 4,804,132 A | 2/1989 | DiFrancesco |

(Continued)

FOREIGN PATENT DOCUMENTS

| | | |
|---|---|---|
| EP | 0298219 A2 | 1/1989 |
| EP | 0361779 A1 | 4/1990 |

(Continued)

OTHER PUBLICATIONS

"New Product Release: Reliant Switch for better RF testing," DowKey.com, copyright 2010, retrieved on Feb. 3, 2015, http://www.dowkey.coininews details.php?id=110.

(Continued)

*Primary Examiner* — Farhana A Hoque
(74) *Attorney, Agent, or Firm* — Burns & Levinson LLP (57) ABSTRACT

An example apparatus includes a cover to shield, at least partly, a conductive trace on a surface of a circuit board from electromagnetic interference. The cover includes a conductive surface that faces the conductive trace. The cover at least partly encloses a volume over the conductive trace. The volume is for holding air over the conductive trace. One or more contacts electrically connect the conductive surface of the cover to electrical ground on the circuit board.

26 Claims, 6 Drawing Sheets

(56) References Cited

U.S. PATENT DOCUMENTS

| | | |
|---|---|---|
| 4,912,399 A | 3/1990 | Greub et al. |
| 4,918,383 A | 4/1990 | Huff et al. |
| 4,922,192 A | 5/1990 | Gross et al. |
| 4,954,873 A | 9/1990 | Lee et al. |
| 4,975,638 A | 12/1990 | Evans et al. |
| 4,980,637 A | 12/1990 | Huff et al. |
| 5,020,219 A | 6/1991 | Leedy |
| 5,072,176 A | 12/1991 | Miller et al. |
| 5,083,697 A | 1/1992 | DiFrancesco |
| 5,105,557 A | 4/1992 | Leedy |
| 5,132,613 A | 7/1992 | Papae et al. |
| 5,180,977 A | 1/1993 | Huff et al. |
| 5,264,787 A | 11/1993 | Woith et al. |
| 5,355,079 A | 10/1994 | Evans et al. |
| 5,378,982 A | 1/1995 | Feigenbaum et al. |
| 5,416,429 A | 5/1995 | McQuade et al. |
| 5,422,574 A | 6/1995 | Kister |
| 5,456,404 A | 10/1995 | Robinette, Jr. et al. |
| 5,468,157 A | 11/1995 | Roebuck et al. |
| 5,469,072 A | 11/1995 | Williams et al. |
| 5,623,213 A | 4/1997 | Liu et al. |
| 5,914,613 A | 6/1999 | Gleason et al. |
| 5,968,282 A | 10/1999 | Yamasaka |
| 5,973,405 A | 10/1999 | Keukelaar et al. |
| 6,246,245 B1 | 6/2001 | Akram et al. |
| 6,256,882 B1 | 7/2001 | Gleason et al. |
| 6,307,387 B1 | 10/2001 | Gleason et al. |
| 6,356,098 B1 | 3/2002 | Akram et al. |
| 6,359,337 B1 | 3/2002 | Keukelaar et al. |
| 6,437,584 B1 | 8/2002 | Gleason et al. |
| 6,444,922 B1 | 9/2002 | Kwong |
| 6,494,734 B1 | 12/2002 | Shuey |
| 6,499,216 B1 | 12/2002 | Fjelstad et al. |
| 6,566,898 B2 | 5/2003 | Theissen et al. |
| 6,578,264 B1 | 6/2003 | Gleason et al. |
| 6,586,955 B2 | 7/2003 | Fjelstad et al. |
| 6,633,175 B1 | 10/2003 | Evans et al. |
| 6,661,244 B2 | 12/2003 | McQuade et al. |
| 6,690,186 B2 | 2/2004 | Fjelstad et al. |
| 6,708,386 B2 | 3/2004 | Gleason et al. |
| 6,756,797 B2 | 6/2004 | Brandorff et al. |
| 6,825,677 B2 | 11/2004 | Gleason et al. |
| 6,838,890 B2 | 1/2005 | Tervo et al. |
| 6,860,009 B2 | 3/2005 | Gleason et al. |
| 6,911,835 B2 | 6/2005 | Chraft et al. |
| 6,927,585 B2 | 8/2005 | Gleason et al. |
| 6,927,586 B2 | 8/2005 | Thiessen |
| 6,930,498 B2 | 8/2005 | Tervo et al. |
| 6,965,244 B2 | 11/2005 | Miller et al. |
| 7,084,657 B2 | 8/2006 | Matsumura |
| 7,109,731 B2 | 9/2006 | Gleason et al. |
| 7,148,711 B2 | 12/2006 | Tervo et al. |
| 7,161,363 B2 | 1/2007 | Gleason et al. |
| 7,178,236 B2 | 2/2007 | Gleason et al. |
| 7,227,371 B2 | 6/2007 | Miller |
| 7,233,160 B2 | 6/2007 | Hayden et al. |
| 7,266,889 B2 | 9/2007 | Gleason et al. |
| 7,271,603 B2 | 9/2007 | Gleason et al. |
| 7,285,969 B2 | 10/2007 | Hayden et al. |
| 7,304,488 B2 | 12/2007 | Gleason et al. |
| 7,355,420 B2 | 4/2008 | Smith et al. |
| 7,368,927 B2 | 5/2008 | Smith et al. |
| 7,400,155 B2 | 7/2008 | Gleason et al. |
| 7,403,025 B2 | 7/2008 | Tervo et al. |
| 7,403,028 B2 | 7/2008 | Campbell et al. |
| 7,417,446 B2 | 8/2008 | Hayden et al. |
| 7,420,381 B2 | 9/2008 | Burcham et al. |
| 7,427,868 B2 | 9/2008 | Strid et al. |
| 7,436,194 B2 | 10/2008 | Gleason et al. |
| 7,443,181 B2 | 10/2008 | Miller |
| 7,443,186 B2 | 10/2008 | Strid et al. |
| 7,449,899 B2 | 11/2008 | Campbell et al. |
| 7,453,275 B2 | 11/2008 | Yamaguchi |
| 7,453,276 B2 | 11/2008 | Hayden et al. |
| 7,456,646 B2 | 11/2008 | Hayden et al. |
| 7,482,823 B2 | 1/2009 | Gleason et al. |
| 7,489,149 B2 | 2/2009 | Gleason et al. |
| 7,492,175 B2 | 2/2009 | Smith et al. |
| 7,495,461 B2 | 2/2009 | Hayden et al. |
| 7,498,829 B2 | 3/2009 | Gleason et al. |
| 7,501,842 B2 | 3/2009 | Gleason et al. |
| 7,504,842 B2 | 3/2009 | Schwindt |
| 7,514,944 B2 | 4/2009 | Smith et al. |
| 7,518,387 B2 | 4/2009 | Gleason et al. |
| 7,533,462 B2 | 5/2009 | Gleason et al. |
| 7,535,247 B2 | 5/2009 | Andrews et al. |
| 7,541,821 B2 | 6/2009 | Gleason et al. |
| 7,601,039 B2 | 10/2009 | Eldridge et al. |
| 7,609,077 B2 | 10/2009 | Campbell et al. |
| 7,619,419 B2 | 11/2009 | Campbell |
| 7,656,172 B2 | 2/2010 | Andrews et al. |
| 7,681,312 B2 | 3/2010 | Gleason et al. |
| 7,688,097 B2 | 3/2010 | Hayden et al. |
| 7,723,999 B2 | 5/2010 | Strid et al. |
| 7,750,652 B2 | 7/2010 | Campbell |
| 7,759,953 B2 | 7/2010 | Strid et al. |
| 7,761,983 B2 | 7/2010 | Hayden et al. |
| 7,761,986 B2 | 7/2010 | Gleason et al. |
| 7,764,072 B2 | 7/2010 | Strid et al. |
| 7,764,075 B2 | 7/2010 | Miller |
| 7,791,361 B2 | 9/2010 | Karklin et al. |
| 7,800,001 B2 | 9/2010 | Hamada et al. |
| 7,876,114 B2 | 1/2011 | Campbell et al. |
| 7,888,957 B2 | 2/2011 | Smith et al. |
| 7,893,704 B2 | 2/2011 | Gleason et al. |
| 7,898,273 B2 | 3/2011 | Gleason et al. |
| 7,898,281 B2 | 3/2011 | Andrews et al. |
| 7,934,944 B2 | 5/2011 | Hamada et al. |
| 7,934,945 B2 | 5/2011 | Narita et al. |
| 7,940,069 B2 | 5/2011 | Andrews et al. |
| 8,013,623 B2 | 9/2011 | Burcham et al. |
| 8,033,838 B2 | 10/2011 | Eldridge et al. |
| 8,202,684 B2 | 6/2012 | Hamada et al. |
| 8,373,428 B2 | 2/2013 | Eldridge et al. |
| 8,410,806 B2 | 4/2013 | Smith |
| 8,451,017 B2 | 5/2013 | Gleason et al. |
| 9,435,855 B2 | 9/2016 | Lewinnek et al. |
| 2003/0122538 A1 | 7/2003 | Parrish et al. |
| 2005/0223543 A1 | 10/2005 | Cohen et al. |
| 2006/0124927 A1 | 6/2006 | Groves et al. |
| 2006/0272856 A1 | 12/2006 | Arnold |
| 2008/0061808 A1 | 3/2008 | Mok et al. |
| 2008/0100323 A1 | 5/2008 | Mayder |
| 2008/0265919 A1 | 10/2008 | Izadian |
| 2011/0095778 A1 | 4/2011 | Chou et al. |
| 2011/0133738 A1* | 6/2011 | Abbink .............. H05K 13/00 324/318 |
| 2012/0017428 A1 | 1/2012 | Hsu et al. |
| 2012/0034820 A1 | 2/2012 | Lang et al. |
| 2012/0175612 A1 | 7/2012 | Ding et al. |
| 2014/0253109 A1* | 9/2014 | Singh .............. G01R 15/20 324/227 |
| 2015/0091594 A1* | 4/2015 | Hamilton .............. G06N 3/02 324/754.21 |

FOREIGN PATENT DOCUMENTS

| | | |
|---|---|---|
| WO | 1988005544 A1 | 7/1988 |
| WO | 2013134568 A1 | 9/2013 |
| WO | 2019152762 A1 | 8/2019 |

OTHER PUBLICATIONS

"Reliant Switch High Repeatability", DowKey.com, Data Sheet; retrieved on Feb. 3, 2015; http://www.dowkey.com news at h file s,10,1.21k12 1 . . . , Reliant Switch . . . patasheet.pdf.

Kister et al., "Test Cost Reduction Using the Membrane Probe", Probe Technology, Santa Clara, CA (at least before Apr. 22, 1997, the issue date of U.S. Pat. No. 5,623,213).

Fisher et al., "Reducing Test Costs for High-Speed and High Pin-Count Devices", Probe Technology, Feb. 1992, Santa Clara, CA.

(56) References Cited

OTHER PUBLICATIONS

Fresh Quest Corporation, "Fresh Quest Corporation Announces the Deliver of QC2TM Bare Die Carriers and QPCTM Probe Cards for the Production of Known Good Die", Chandler, AZ (at least before Apr. 22, 1997, the issue date of U.S. Pat. No. 5,623,213).
Fresh Quest Corporation, "Quest Pricing Guidelines" (at least before Apr. 22, 1997, the issue date of U.S. Pat. No. 5,623,213).
Hewlett Packard, "High Speed Wafer Probing with the HP 83000 Model F660", 1993, Germany.
Hughes Aircraft Company, "Additional Technical Data for Hughes' Membrane Test Probe", 1993.
Hughes, "Membrane Wafer Probe—The Future of the IC Test Industry" (at least before Apr. 22, 1997, the issue date of U.S. Pat. No. 5,623,213).
Packard Hughes Interconnect, "Science Over Art, Our New IC Membrane Test Probe", 1993, Irvine, CA.
Packard Hughes Interconnect, "Our New IC Membrane Test Probe. It's priced the Same, But It Costs Less.", 1993, Irvine, CA.
Probe Technology, "Membrane Probe Card—The Concept" (at least before Apr. 22, 1997, the issue date of U.S. Pat. No. 5,623,213).
Probe Technology, "Prober Interface Unit for HP83000 Model—INT768" (at least before Apr. 22, 1997, the issue date of U.S. Pat. No. 5,623,213).
Chong et al., "The Evolution of MCM Test from High Performance Bipolar Mainframe Multichip Modules to Low Cost Work Station Mulitchip Modules", ICEMM Proceedings '93, pp. 404-410.
Doane, D., "Foreword: Advancing MCM Technologies", IEEE Transactions on Components, Packaging, and Manufacturing Technology—Part B:Advanced Packaging, 17(1):1 (Feb. 1994).
Davidson, E., "Design, Analysis, Applications", IEEE Transactions on Components, Packaging, Manufacturing Technology—Part B: Advanced Packaging, 17(1):2 (Feb. 1994).
Russell, T., "Testing", IEEE Transactions on Components, Packaging, Manufacturing Technology—Part B: Advanced Packaging, 17(1):2 (Feb. 1994).
Marshall et al., "CAD-Based Net Capacitance Testing of Unpopulated MCM Substrates", IEEE Transactions on Components, Packaging, Manufacturing Technology—Part B: Advanced Packaging, 17(1):50-55 (Feb. 1994).
Economikos et al., "Electrical Test of Multichip Substrates", IEEE Transactions on Components, Packaging, Manufacturing Technology—Part B: Advanced Packaging, 17(1):56-61 (Feb. 1994).
Brunner et al., "Electron-Beam MCM Testing and Probing", IEEE Transactions on Components, Packaging, Manufacturing Technology—Part B: Advanced Packaging (1994).
Weste, et al., Principles of CMOS VLSI Design: A Systems Perspective, 2nd Ed., Chapter 8 (1993).
Reid et al., "Micromachined Rectangular-Coaxial Transmission Lines", IEEE Transactions on Microwave Theory and Techniques, vol. 54, No. 8 (Aug. 2006).
Ralston et al., "Liquid-Metal Vertical Interconnects for Flip Chip Assembly of GaAs C-Band Power Amplifiers Onto Micro-Rectangular Coaxial Transmission Lines", IEEE Journal of Solid-State Circuits, vol. 47, No. 10 (Oct. 2012).
International Search Report and Written Opinion; PCT/US2014/063646; dated Jan. 28, 2015; 15 pp.
International Preliminary Report on Patentability for International Patent Application No. PCT/US2020/048933, dated Mar. 17, 2022, (7 pages).
Written Opinion for International Patent Application No. PCT/US2020/048933, dated Dec. 8, 2020, (5 pages).
International Search Report for International Patent Application No. PCT/US2020/048933, dated Dec. 8, 2020, (5 pages).

\* cited by examiner

EMI SHIELDING FOR A SIGNAL TRACE

TECHNICAL FIELD

This specification describes examples of electromagnetic interference (EMI) shielding for a signal trace.

BACKGROUND

Crosstalk is a type of electromagnetic interference that results on one conductor from a signal transmitted on a different conductor. Crosstalk can be particularly problematic when two conductors in close proximity to each other carry high-frequency signals. EMI shielding can reduce or eliminate crosstalk and other types of electromagnetic interference between two conductors.

SUMMARY

An example apparatus includes a cover to shield, at least partly, a conductive trace on a surface of a circuit board from electromagnetic interference. The cover includes a conductive surface that faces the conductive trace. The cover at least partly encloses a volume over the conductive trace. The volume is for holding air over the conductive trace. One or more contacts electrically connect the conductive surface of the cover to electrical ground on the circuit board. The example apparatus may include one or more of the following features, either alone or in combination.

The cover may include an indentation that defines the volume at least partly. The indentation may have a lateral width that is between 3 mils (76.2 microns) and 30 mils (762 microns) inclusive. The cover may include multiple indentations, with one of the indentations defining the volume at least partly and with others of the indentations defining other volumes over other conductive traces. Each of the other volumes are for holding air over a corresponding conductive trace.

The volume is a first volume and the conductive trace is a first conductive trace, and the cover may at least partly enclose a second volume that is different from the first volume. The second volume is for holding air over a second conductive trace. The cover may include a first indentation that defines the first volume and a second indentation that defines the second volume. The one or more contacts may include a first contact a side of the first indentation, a second contact on a side of the second indentation, and a third contact between the first indentation and the second indentation. The cover may be configured to hold the air in direct contact with the conductive trace. The one or more contacts may be integral parts of the cover. The one or more contacts may be separate components from the cover.

The conductive surface may include at least one of the following: copper; aluminum; gold; silver; an alloy of copper, aluminum, gold, or silver; or a nickel-cobalt ferrous alloy. An entirety of the cover may include conductive material. The conductive material may form the conductive surface. The cover may include a non-conductive material. The conductive surface may be connected to the non-conductive material.

The cover may include a first indentation that defines the volume at least partly and a second indentation that defines a second volume at least partly. The first indentation may be separated from the second indentation by 78 mils (1981.2 microns) or less at a point on the circuit board containing electrical contacts for the conductive traces. The apparatus may be configured for removal from the circuit board. In an example, the apparatus is not an integral part of the circuit board.

An example test system includes test instruments including a radio frequency (RF) test instrument for sending signals to, and receiving signals from, a device under test (DUT). A device interface board (DIB) is for connecting the test instrument to the DUT. The DIB includes conductive traces on a surface of the DIB. The conductive traces are for carrying the signals. At least some of the signals are at 800 megahertz (MHz) or more. An electromagnetic interference (EMI) shield is attachable to, and removable from, the surface of DIB. The EMI shield includes a cover to enclose one or more of the conductive traces at least partly. The cover includes a conductive material having one or more indentations that define one or more volumes to hold air over the one or more conductive traces. The example system may include one or more of the following features, either alone or in combination.

The cover may include multiple indentations that define multiple volumes to hold air over multiple conductive traces. At least one of the multiple volumes may have a lateral width that is between 3 mils (76.2 microns) and 30 mils (762 microns) inclusive, and at least two of the multiple volumes may be separated by 78 mils (1981.2 microns) or less at a point on the DIB where the DUT connects to the DIB. The EMI shield may include one or more contacts to make an electrical connection between the cover and electrical ground on the DIB. An entirety of the cover may include the conductive material. The cover may include a non-conductive material. The conductive material may be connected to the non-conductive material and may be configured to face the conductive trace. The system may include means for attaching the EMI shield to the DIB. The system may include one or more bars across the cover that are configured to attach the EMI shield to the surface of the DIB. The system may include one or more screws for attaching the EMI shield to the surface of the DIB. The EMI shield may be attached to the surface of the DIB using solder.

The DIB may include first contacts for connecting electrically to one or more of the test instruments and second contacts for connecting electrically to the DUT. The conductive traces may decrease in pitch from locations of the first contacts to locations of the second contacts.

Any two or more of the features described in this specification, including in this summary section, may be combined to form implementations not specifically described in this specification.

At least part of the test systems and processes described in this specification may be configured or controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the test systems and processes described in this specification may be configured or controlled using a computing system comprised of one or more processing devices and memory storing instructions that are executable by the one or more processing devices to perform various control operations.

The details of one or more implementations are set forth in the accompanying drawings and the following description. Other features and advantages will be apparent from the description and drawings, and from the claims.

DESCRIPTION OF THE DRAWINGS

Like reference numerals in different figures indicate like elements.

DETAILED DESCRIPTION

Described herein are example EMI shields for shielding conductive traces from electromagnetic interference, such as crosstalk. An example EMI shield includes a cover to shield one or more conductive traces on a surface of a circuit board. The cover includes a conductive surface that faces a conductive trace. The cover at least partly encloses a volume filled with air over the conductive trace. Air provides less electromagnetic resistance than other types of dielectrics. As a result, signals can propagate through the conductive trace more quickly and with less loss of signal integrity. The EMI shield also includes contacts. The contacts may be integral parts of the cover or separate conductive structures that electrically connect to the conductive surface on the cover. The contacts electrically connect the conductive surface to an electrical ground located on or in the circuit board, for example. The resulting EMI shield reduces the amount of electromagnetic interference that reaches the conductive trace and the amount of electromagnetic interference that the conductive trace outputs to neighboring conductive traces. That is, the conductive trace is wholly or partially surrounded by electrically grounded conductive material, which absorbs both incoming and outing electromagnetic interference transmitted through the air.

The example EMI shields are described herein for use with a test system, such as automatic test equipment (ATE). However, the EMI shields are not limited to use with the example test systems described herein or to use with testing in general. Rather, the EMI shields may be used in any appropriate technological context.

Figure 1:
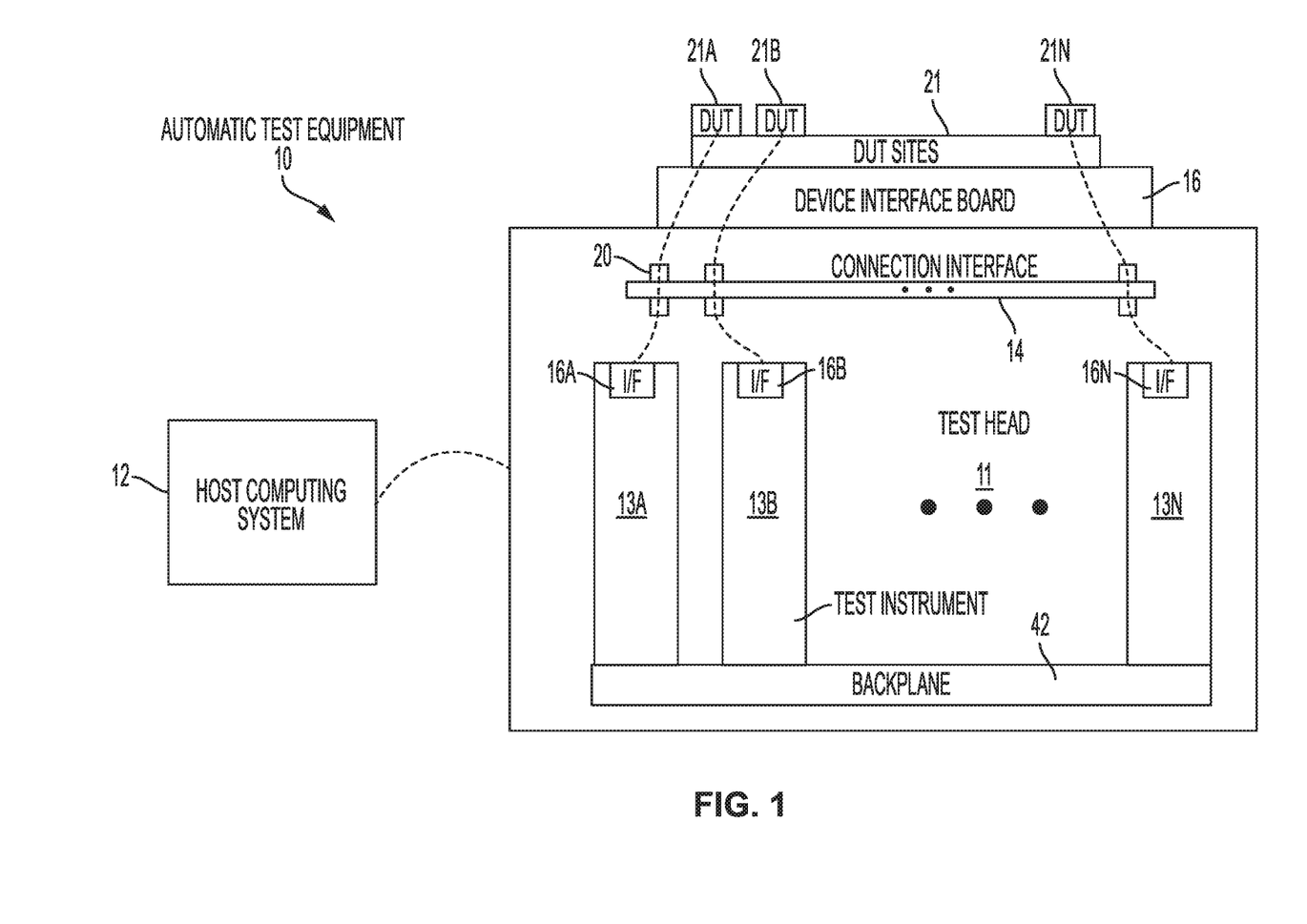
FIG. 1 is a block diagram of components of an example test system on which the example EMI shield described herein may be used.

FIG. 1 shows components of example ATE 10. In FIG. 1, the dashed lines represent, conceptually, potential signal paths between components of the system.

ATE 10 includes a test head 11 and a host computing system 12. The host computing system is a control system in this example. The host computing system may include a computing system comprised of one or more microprocessors or other appropriate processing devices as described herein. A device interface board (DIB) 16 includes a printed circuit board (PCB) that is connected to test head 11 and that includes mechanical and electrical interfaces to one or more devices under test (DUTs) 21A to 21N that are being tested or are to be tested by the ATE.

In the example of FIG. 1, DIB 16 connects, electrically and mechanically, to test head 11. The DIB includes sites 21, which may include pins, conductive traces, or other points of electrical and mechanical connection to which the DUTs may connect. Test signals, response signals, and other signals pass via test channels over the sites between the DUTs and test instruments. DIB 16 may also include, among other things, connectors, conductive traces, and circuitry for routing signals between the test instruments, DUTs connected to sites 21, and other circuitry.

Figure 2:
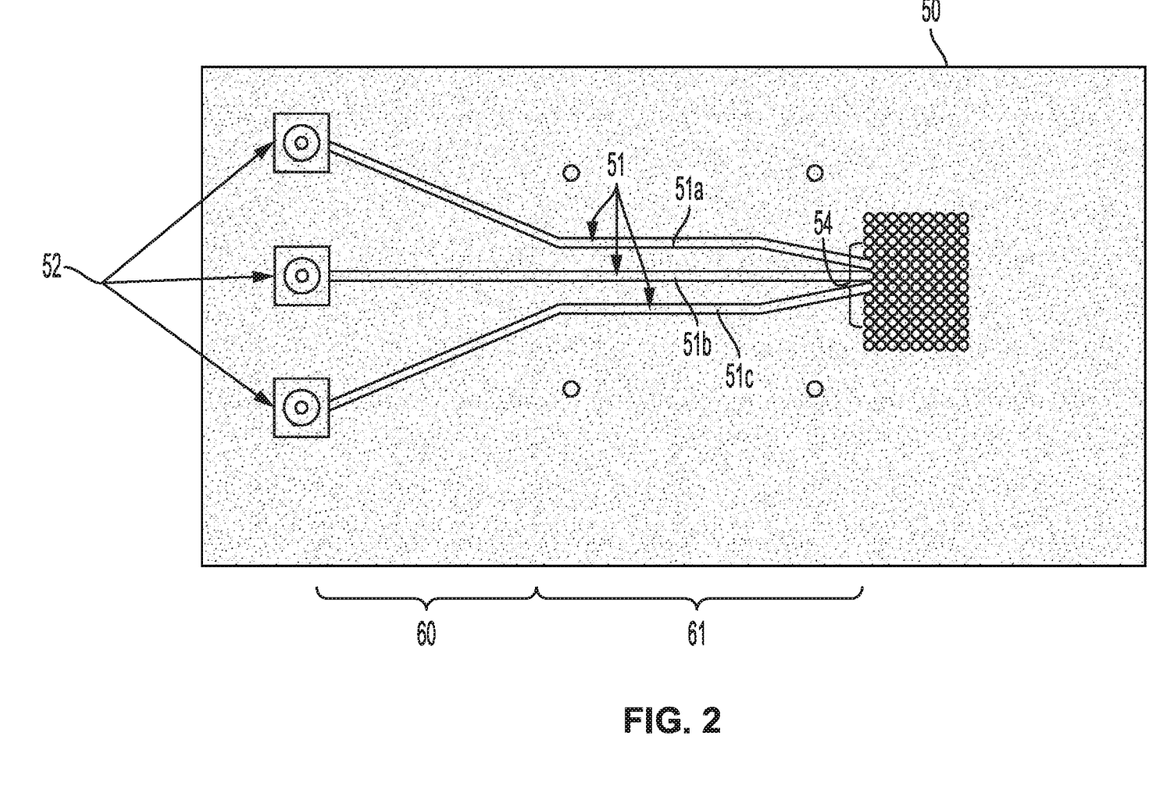
FIG. 2 is a top view of an example device interface board.

In some implementations, the conductive traces are on the surface of the DIB. For example, as shown in FIG. 2, example DIB 50 includes three conductive traces 51. Although only three conductive traces are shown, a DIB such as DIB 50 may include any appropriate number of conductive traces arranged in any appropriate configuration. In this regard, example DIB 50 includes contacts 52 for electrically connecting the DIB to one or more test instruments, which are described below. The DIB also includes contacts 54 for electrically connecting a DUT to the DIB. In this example, conductive traces 51 run between contacts 52 and 54. The resulting electrical connections on the DIB allow signals to pass between a DUT and one or more test instruments on the ATE. In this example, the conductive traces decrease in pitch from locations of contacts 52 to locations contacts 54. In an example, pitch includes the distance between adjacent conductive traces. In an example, pitch is defined by the total or partial width across a set of adjacent conductive traces. Decreasing the pitch of the conductive traces increases the likelihood of electromagnetic interference, such as crosstalk, among two or more of the conductive traces.

The example conductive traces 51 run on and along a surface of the DIB. As a result, the conductive traces are at least partly exposed to air. Air has a lower electromagnetic resistance than other types of dielectrics. Therefore, signals may travel through the conductive traces that are exposed to air at a greater speed than through conductive traces that are not exposed to air. This can be particularly advantageous for testing radio frequency (RF) circuitry on a DUT. The DIB may also include electrical connections that run through the interior of the DIB.

Referring back to FIG. 1, host computing system 12 communicates with components of the test head to control testing. For example, host computing system 12 may download test program sets to test instruments 13A to 13N in the test head. The test instruments are hardware devices that may include one or more processing devices and other circuitry. Test instruments 13A to 13N may run the test program sets to test DUTs in communication with the test instruments. Host computing system 12 may also send, to test instruments in the test head, instructions, test data, and/or other information that are usable by the test instruments to perform appropriate tests on DUTs interfaced to the DIB. In some implementations, this information may be sent via a computer or other type of network or via a direct electrical path. In some implementations, this information may be sent via a local area network (LAN) or a wide area network (WAN).

In the example of FIG. 1, ATE 10 includes multiple test instruments 13A to 13N, each of which may be configured, as appropriate, to perform one or more of testing and/or other functions. Although only three test instruments are depicted, the system may include any appropriate number of test instruments, including those residing outside of test head 11. In some implementations, each test instrument may be configured to output test signals to test a DUT based, e.g., on data provided by the host computing system, and to receive response signals from the DUT. Different test instruments may be configured to perform different types of tests and/or be configured to test different DUTs. The received signals may include response signals that are based on the test signals and/or signals that originate from the DUT that are not prompted by (e.g., are not in response to) test signals. In some implementations, there may be electrical conductors, such as copper wires, between the DUT, the DIB, and the test instrument interfaces over which test and response signals are sent.

In this example, the test instruments may include one or more RF test instruments. Among their other functions, RF test instruments test RF circuitry on the DUTs. In some examples, DUTs have large numbers of RF ports for sending and receiving RF signals, for example, 128 ports. For example, the RF signals may have frequencies of 800 megahertz (MHz) or more. The more ports, such as RF ports, that a DUT contains, the greater the number of signals that must be sent to and from the DUT. Since there is a limited amount of space on the DIB, this inevitably increases the density of conductive traces on the surface of the DIB. Increasing the density of the conductive traces also increases the likelihood of electromagnetic interference, such as crosstalk, between adjacent or other traces. Accordingly, the example system described herein employs EMI shielding to electromagnetically shield the conductive traces and thereby reduce the EMI interference among the conductive traces. Examples of the EMI shielding are described below. While the shielding may be particularly useful in the case of RF testing, the shielding may be used to electromagnetically shield conductive traces that run between a DUT and any type of test instrument. In this regard, the test system may include types of test instruments other than RF test instruments. For example, the system may include VI (voltage-current) test instruments. In other examples, test instruments may be included that are configured to produce alternating current (AC) voltage and/or AC current signals having frequencies, for example, that are greater than 1 kilohertz (KHZ), on a test channel.

Signals may be sent to, and received from, the DUT over multiple test channels. In some examples, a test channel may include the physical transmission medium or media over which signals are sent from the test instrument to a DUT and over which signals are received from the DUT. Physical transmission media may include, but are not limited to, electrical conductors alone or in combination with optical conductors, wireless transmission media, or both optical conductors and wireless transmission media. In some examples, a test channel may include a range of frequencies over which signals are transmitted over one or more physical transmission media. A test channel may include and/or electrically connect to a conductive trace on the DIB.

Each test instrument has a corresponding interface (I/F) circuit 16A to 16N for outputting signals to, and receiving signals from, a corresponding DUT via the DIB. In some implementations, each interface circuit may be implemented using a device, such as an FPGA, an application-specific integrated circuit (ASIC), or other appropriate hardware. Input circuitry and output circuitry for a test instrument may reside in the interface of each test instrument. In this regard, each test instrument may include input circuitry for receiving signals from one or more DUTs or other appropriate signal source(s). Each test instrument may also include output circuitry for outputting signals to a communication channel defined by the test instrument.

In the implementation of FIG. 1, test instruments 13A to 13N may be interconnected through backplane 42 or any other appropriate electrical or mechanical mechanism. For example, test instruments 13A to 13N may mechanically interface, e.g., plug into, backplane 42 of FIG. 1. Backplane 42 may include one or more transmission media over which signals pass among the various components of FIG. 1, including the test instruments and the test computer/host computing system. In some implementations, the transmission media may be, or include, one or more serial buses such as a peripheral component interconnect express (PCIe) bus, Ethernet cable, or appropriate types of copper or other conductive transmission media.

In some examples, ATE 10 includes a connection interface 14 that connects test instrument test channels 15 to a DIB 16. Connection interface 14 may include connectors 20 or other devices for routing signals between the test instruments and DIB 16. For example, the connection interface may include one or more circuit boards or other substrates on which such connectors are mounted. Conductors that are included in the test channels may be routed through the connection interface and the DIB.

Figure 3:
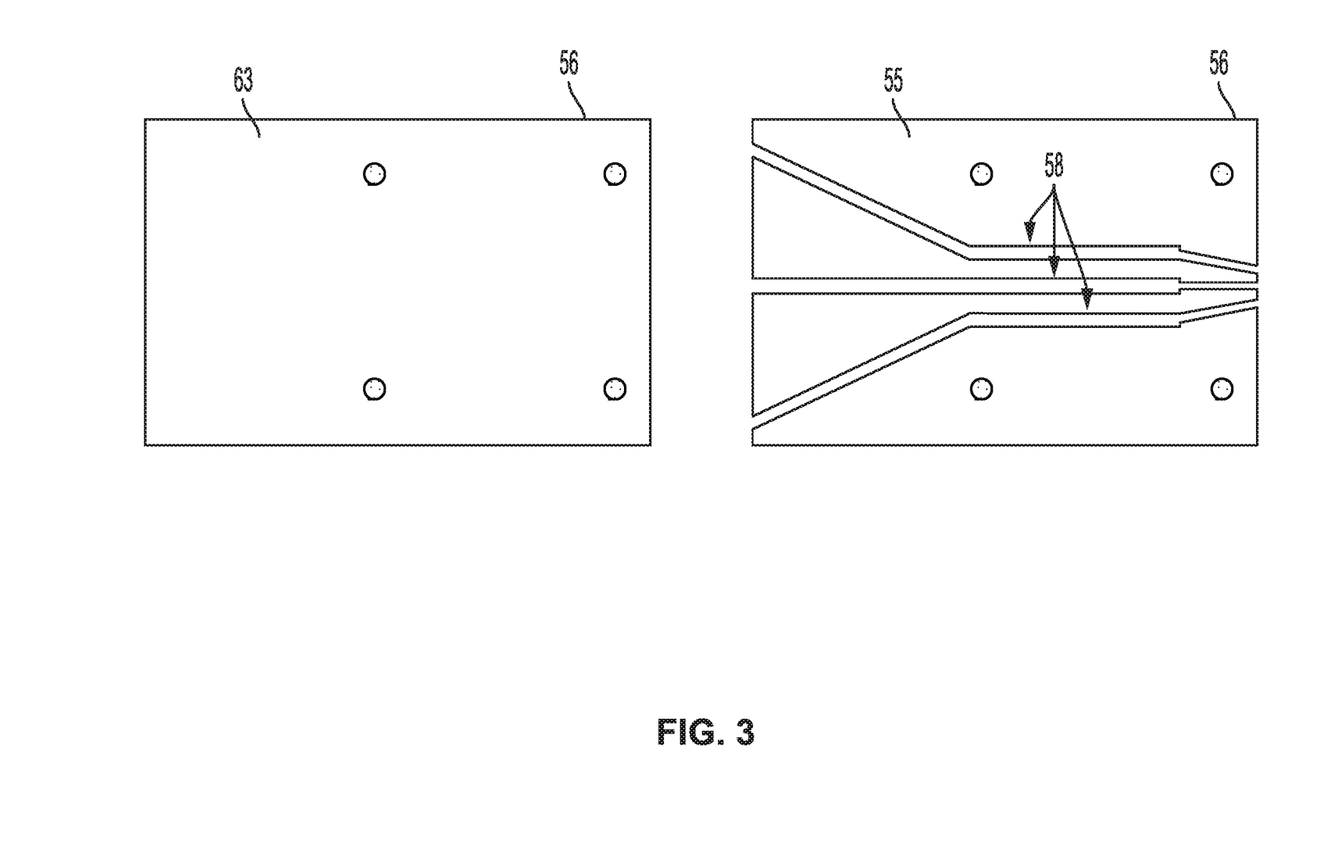
FIG. 3 shows two surfaces of an EMI shield cover, with the surface on the right facing towards conductive traces of a circuit board and with the surface on the left facing away from the conductive traces.
Figure 4:
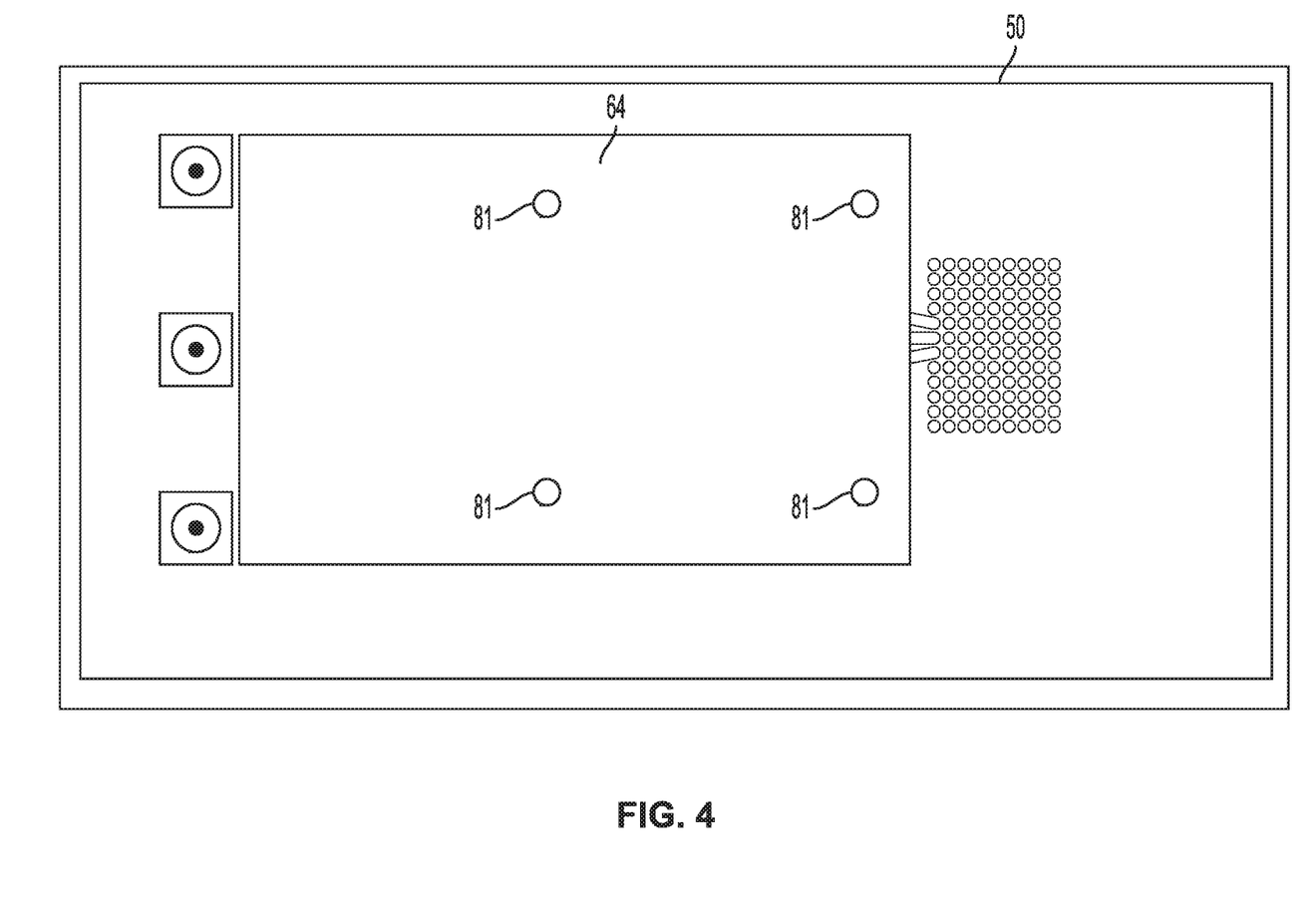
FIG. 4 is a top view showing an EMI shield connected to a device interface board.

Referring back to FIG. 2, as noted, conductive traces 51 run between instrument contacts 52 and DUT contacts 54. As also noted, at least part of the conductive traces are disposed on the surface of the DIB and, as a result, at least part of the conductive traces are exposed to air. To shield the conductive traces exposed to air, in an example, an example EMI shield includes a cover that has indentations that complement the shape of at least part of, at least one of, the conductive traces. The cover fits over all or part of the DIB. The cover includes a conductive surface that faces the conductive traces. The conductive surface may be made of any appropriate conductive material, including, but not limited to, one or more of copper; aluminum; gold; silver; an alloy of copper, aluminum, gold, or silver; or a nickel-cobalt ferrous alloy such as Kovar®. In the example of FIG. 3, the surface 55 of cover 56 that faces the conductive traces has indentations 58 that complement (e.g., have complementary shapes as) all of the traces of FIG. 2. The surface 63 of cover 56 that faces away from the conductive traces is also shown in FIG. 3. FIG. 4 shows the cover, which is part of EMI shield 64, over substantially all of the conductive traces on DIB 50.

As noted above, in the example of FIG. 3, the conductive surface of the EMI shield has indentations that complement all traces on the circuit board. However, the indentations may complement only some conductive traces, only parts of the conductive traces, or only parts of only some of the conductive traces. For example, in some cases, only part of the traces may require EMI shielding. For example, in FIG. 2, the pitch of conductive traces at region 60 may be sufficiently large that crosstalk is not a problem and therefore EMI shielding is not required in region 60. Accordingly, in this example, the EMI shielding may be limited to region 61 where the conductive traces are at a finer pitch and, therefore, more susceptible to crosstalk. In some implementations, fewer than all traces may be shielded using the cover. For example, in some implementations, every other trace may be shielded. More specifically, because crosstalk is partly a function of the distance between traces, it may not be necessary to shield every single trace, but rather only to shield enough traces to limit crosstalk between unshielded traces. For example, in the case of FIG. 2, shielding only trace 51b may reduce or eliminate crosstalk since traces 51a and 51c may be too far apart for signals traveling through those traces to interfere electromagnetically with each other.

The indentations on the conductive surface of the EMI shield may be formed using micromachining tools in some implementations. The indentations on the conductive surface may be formed during construction of the conductive surface. For example, the conductive surface may be molded and the mold may include the indentations. For example, the conductive surface may be formed using three-dimensional (3D) printing. For example, the conductive surface may be formed using stamping. Other techniques for forming the conductive surfaces may also be used.

Cover 56 at least partly encloses a volume over a conductive trace. For example, each indentation covers a complementary trace, but is larger than that trace in both width and depth. As a result, when the cover mates to the DIB, a volume is formed over each conductive trace that covers the conductive trace. The volume contains air and holds the air over, and in direct contact with, the conductive trace. As a result, the conductive trace remains exposed to air within the volume, thereby retaining the benefits of being at least partly surrounded by an air dielectric while also being shielded electromagnetically from environmental electromagnetic signals.

The EMI shield includes one or more contacts that electrically connect the conductive surface of the cover to electrical ground on the DIB or other circuit board. In this regard, these contacts may be integral parts of the cover or these contacts may be separate components from the cover. For example, in some implementations, the entire EMI shield, including the cover, may be made of a conductive material, such as copper; aluminum; gold; silver; an alloy of copper, aluminum, gold, or silver; and/or a nickel-cobalt ferrous alloy such as Kovar®. In these examples, the contacts may be formed as an integral part of structure that makes up the EMI shield as shown, for example, in FIGS. 5 and 6. In some implementations, the cover may include a non-conductive material and the conductive surface containing the indentations may be connected to the non-conductive material. For example, the non-conductive material may be plastic or FR-4. The conductive surface may be fixed to the non-conductive material such that the conductive surface faces the conductive traces on the DIB. In such implementations, the contacts to the cover may be integral parts of the conductive surface or they may be separate components that are connected to the cover and that are connected electrically to the conductive surface. The contacts on the EMI shield may be connected to the electrical grounds on the DIB using solder, for example.

Figure 5:
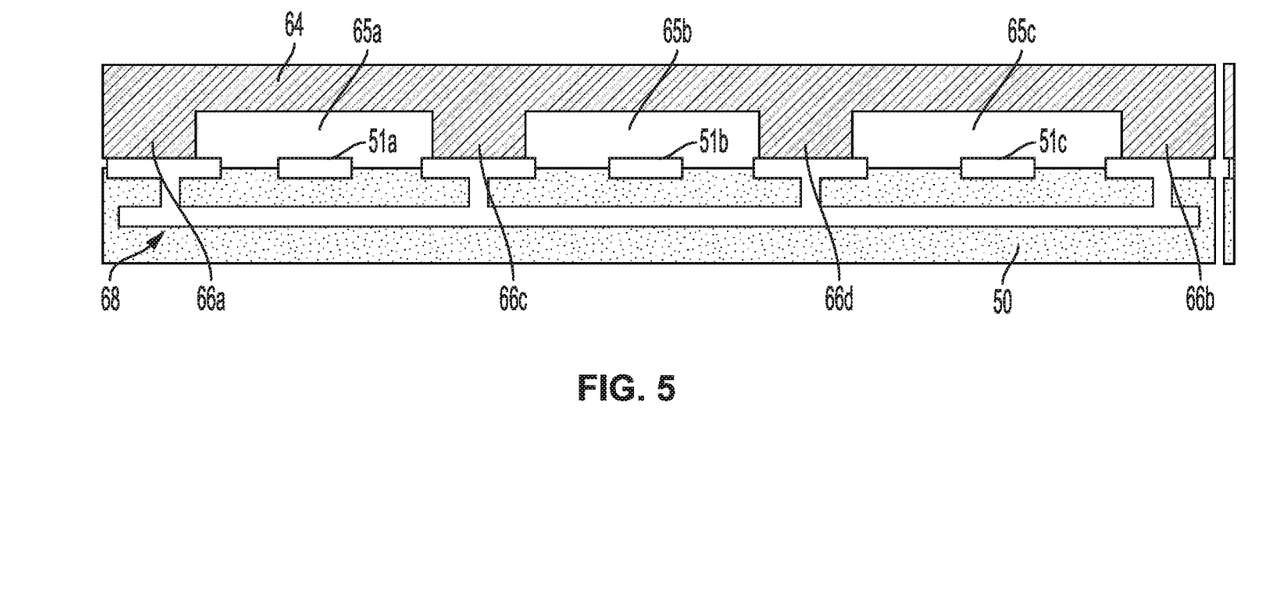
FIG. 5 is a cut-away side view of the EMI shield connected to the device interface board.

FIG. 5 is a side view of example EMI shield 64 connected to example DIB 50. In this example, the EMI shield is not part of the underlying DIB; that is, the EMI shield is not integrated into, or formed with, the DIB. Rather, the shield can be added to, or removed from, the DIB, using appropriate tools. As such, the EMI shield may be reused on circuit boards having a surface trace configuration that matches, in whole or part, the configuration of the indentations on the conductive surface of the EMI shield.

In some implementations, the EMI shield may be connected to the DIB using one or more removable bars across the cover that are configured to be tightened to attach the EMI shield to the surface of the DIB. In some implementations, the EMI shield may be connected to the DIB using one or more removable screws. For example, FIG. 4 shows four screw holes 81 for attaching the EMI shield to the DIB.

In the example of FIG. 5, the cover includes three indentations, with one of the indentations defining a volume over conductive trace 51a and with others of the indentations defining other volumes over the other conductive traces. The volumes thus include a first volume 65a for first conductive trace 51a, a different second volume 65b for second conductive trace 51b, and a different third volume 65c for third conductive trace 51c. As shown, each volume is fully or partially electromagnetically isolated from the other volumes and each trace 51a, 51b, and 51c is exposed to air in respective volumes 65a, 65b, and 65c. The contacts include a first contact 66a on a side of the indentation defining volume 65a, a second contact 66b on a side of the indentation defining volume 65c, and contacts 66c and 66d between indentations and between the other two contacts 66a and 66b. As shown in FIG. 5, the contacts connect electrically to an electrical ground plane 68 in the DIB. In some implementations, the volumes are air-tight, whereas in other implementations the volumes are not air-tight. In some implementations, there may be parts of the conductive traces that are not covered by the EMI shield; that is, each volume may cover only part of a conductive trace.

Figure 6:
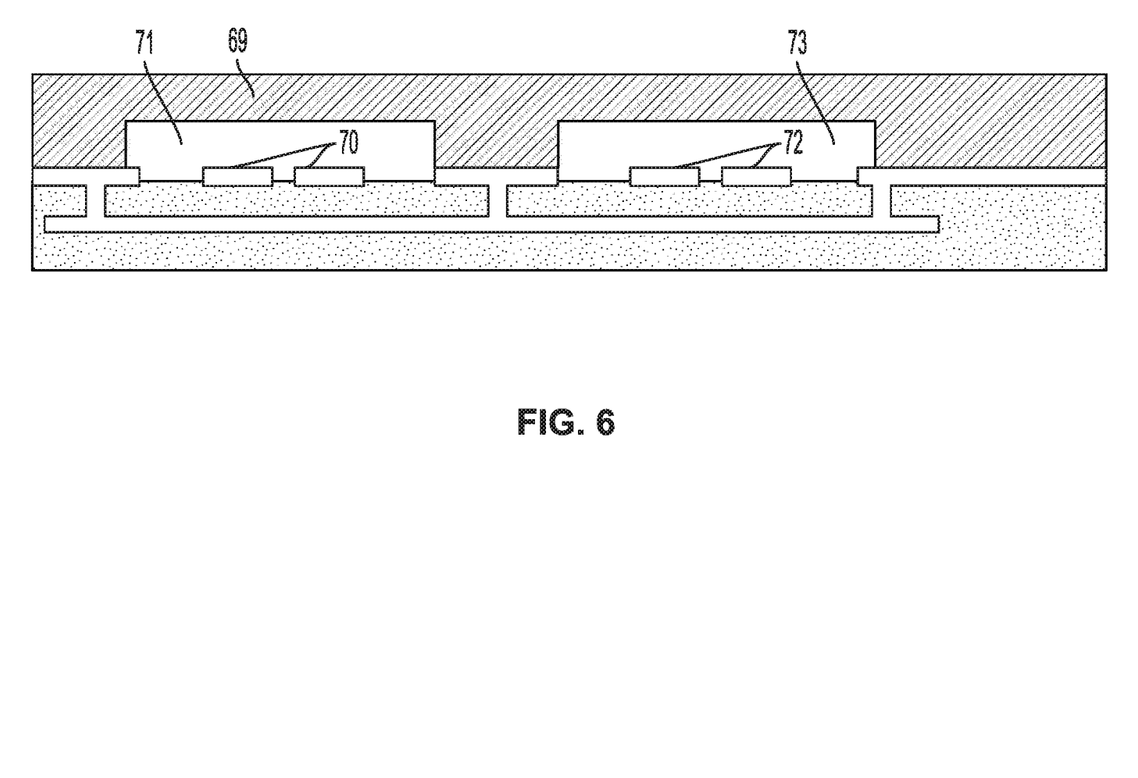
FIG. 6 is a cut-away side view of the EMI shield connected to a device interface board that contains traces that transmit differential signals.

In some implementations, each conductive trace may be shielded in a separate volume, as shown in FIG. 5. This may reduce the chances of crosstalk or other electromagnetic interference between adjacent conductive traces. In some implementations, conductive traces that carry differential signals are shielded in the same volume. For example, as shown in FIG. 6, in EMI shield 69, differential signal pair 70 is shielded within volume 71 and differential signal pair 72 is shielded within volume 73. The remaining features of the DIB and the EMI shield are the same as, or substantially the same as, the features described with respect to FIGS. 1 to 5.

The EMI shield and the indentations may have any appropriate sizes and shapes. In an example, a volume created by an indentation over a conductive trace has a lateral width that is between 3 mils (76.2 microns) and 30 mils (762 microns) inclusive (e.g., 5 mils (126 microns)). In an example, at least two of multiple volumes created by the EMI shield over different traces are separated by 78 mils (1981.2 microns) or less at a point on the DIB where the DUT connects to the DIB.

In some implementations, a conductive plate having micro-machined grooves or channels creates shielding and/or an impedance structure to surface traces, which are single-ended or differential, on a printed circuit board (PCB). The plate may be mechanically attached to the PCB's outer layers. The added shielding that the plate provides will enable signals to be brought closer together at faster speeds.

All or part of the test systems and processes described in this specification and their various modifications may be configured or controlled at least in part by one or more computers such as host computing system 12 using one or more computer programs tangibly embodied in one or more information carriers, such as in one or more non-transitory machine-readable storage media. A computer program can be written in any form of programming language, including compiled or interpreted languages, and it can be deployed in any form, including as a stand-alone program or as a module, part, subroutine, or other unit suitable for use in a computing environment. A computer program can be deployed to be executed on one computer or on multiple computers at one site or distributed across multiple sites and interconnected by a network.

Actions associated with configuring or controlling the test systems and processes can be performed by one or more programmable processors executing one or more computer programs to control all or some of the well formation operations described previously. All or part of the test systems and processes can be configured or controlled by special purpose logic circuitry, such as, an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Non-transitory machine-readable storage media suitable for embodying computer program instructions and data include all forms of non-volatile storage area, including by way of example, semiconductor storage area devices, such as EPROM (erasable programmable read-only memory), EEPROM (electrically erasable programmable read-only memory), and flash storage area devices; magnetic disks, such as internal hard disks or removable disks; magneto-optical disks; and CD-ROM (compact disc read-only memory) and DVD-ROM (digital versatile disc read-only memory).

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. An apparatus comprising:
   a cover to shield, at least partly, a conductive trace on a surface of a circuit board from electromagnetic interference, the cover comprising a conductive surface that faces the conductive trace, the cover at least partly enclosing a volume over the conductive trace, the volume for holding air over the conductive trace, and the volume having a shape that is complementary to a shape of at least part of the conductive trace that extends between two electrical contacts, where the shape that is complementary comprises an indentation having a shape that tracks a shape of the conductive trace; and
   one or more ground contacts that electrically connect the conductive surface of the cover to electrical ground on the circuit board.

2. The apparatus of claim 1, wherein the indentation has a shape that tracks a shape of an entirety of the conductive trace.

3. The apparatus of claim 1, wherein the indentation has a lateral width that is between 3 mils (76.2 microns) and 30 mils (762 microns) inclusive.

4. The apparatus of claim 1, wherein the cover comprises multiple indentations, the indentations the indentation defines the volume at least partly and with others of the indentations defining other volumes over other conductive traces, each of the other volumes for holding air over a corresponding conductive trace.

5. An apparatus comprising:
   a cover to shield, at least partly, a conductive trace on a surface of a circuit board from electromagnetic interference, the cover comprising a conductive surface that faces the conductive trace, the cover at least partly enclosing a volume over the conductive trace, the volume for holding air over the conductive trace; and
   one or more contacts that electrically connect the conductive surface of the cover to electrical ground on the circuit board;
   wherein the volume is a first volume and the conductive trace is a first conductive trace; and
   wherein the cover at least partly encloses a second volume that is different from the first volume, the second volume for holding air over a second conductive trace.

6. The apparatus of claim 5, wherein the cover comprises a first indentation that defines the first volume and a second indentation that defines the second volume.

7. The apparatus of claim 6, wherein the one or more contacts comprises a first contact on a side of the first indentation, a second contact on a side of the second indentation, and a third contact between the first indentation and the second indentation.

8. The apparatus of claim 1, wherein the cover is configured to hold the air in direct contact with the conductive trace.

9. The apparatus of claim 5, wherein the one or more contacts are integral parts of the cover.

10. The apparatus of claim 5, wherein the one or more contacts are separate components from the cover.

11. The apparatus of claim 1, wherein the conductive surface comprises at least one of the following: copper; aluminum; gold; silver; an alloy of copper, aluminum, gold, or silver, or a nickel-cobalt ferrous alloy.

12. The apparatus of claim 1, wherein an entirety of the cover comprises conductive material, the conductive material forming the conductive surface.

13. The apparatus of claim 1, wherein the cover comprises a non-conductive material; the conductive surface being connected to the non-conductive material.

14. An apparatus comprising:
   a cover to shield, at least partly, a conductive trace on a surface of a circuit board from electromagnetic interference, the cover comprising a conductive surface that faces the conductive trace, the cover at least partly enclosing a volume over the conductive trace, the volume for holding air over the conductive trace; and
   one or more ground contacts that electrically connect the conductive surface of the cover to electrical ground on the circuit board;
   wherein the cover comprises a first indentation that defines the volume at least partly and a second indentation that defines a second volume at least partly, the first indentation being separated from the second indentation by 78 mils (1981.2 microns) or less at a point on the circuit board containing electrical contacts for the conductive traces.

15. The apparatus of claim 1, wherein the apparatus is configured for removal from the circuit board.

16. The apparatus of claim 1, wherein the apparatus is not an integral part of the circuit board.

17. A test system comprising:
   test instruments including a radio frequency (RF) test instrument for sending signals to, and receiving signals from, a device under test (DUI);
   a device interface board (DIB) for connecting the test instrument to the DUT, the DIB comprising conductive traces on a surface of the DIB, the conductive traces for carrying the signals, at least some of the signals being at 800 megahertz (MHz) or more; and an electromagnetic interference (EMI) shield that is attachable to, and removable from, the surface of DIB, the EMI shield comprising the apparatus of claim 1;

wherein the circuit board comprises the DIB;

wherein the conductive trace is among the conductive traces on the DIB; and wherein the cover is configured to shield, at least partly, the conductive traces on the DIB from electromagnetic interference, the conductive surface of the cover facing the conductive traces on the DIB, the cover at least partly enclosing a volume over each of the conductive traces on the DIB, each volume for holding air over a corresponding conductive trace.

18. The test system of claim 17, wherein the cover comprises multiple indentations that define multiple volumes to hold air over the conductive traces, at least one of the multiple volumes having a lateral width that is between 3 mils (76.2 microns) and 30 mils (762 microns) inclusive, and at least two of the multiple volumes being separated by 78 mils (1981.2 microns) or less at a point on the DIB where the DUT connects to the DIB.

19. The test system of claim 17, wherein the EMI shield comprises multiple ground contacts to make an electrical connection between the cover and electrical ground on the DIB.

20. The test system of claim 17, wherein an entirety of the cover comprises the conductive material.

21. The test system of claim 17, wherein the cover comprises a non-conductive material, the conductive material being connected to the non-conductive material and being configured to face the conductive trace.

22. The test system of claim 17, further comprising means for attaching the cover to the DIB.

23. The test system of claim 17, further comprising one or more bars across the cover that are configured to attach the cover to the surface of the DIB.

24. The test system of claim 17, further comprising one or more screws for attaching the EMI shield to the surface of the DIB.

25. The test system of claim 17, wherein the cover is attached to the surface of the DIB using solder.

26. The test system of claim 17, wherein the DIB comprises first contacts for connecting electrically to one or more of the test instruments and second contacts for connecting electrically to the DUT, the conductive traces decreasing in pitch from locations of the first contacts to locations of the second contacts.

* * * * *